United States Patent [19]
Szwejkowski et al.

[11] Patent Number: 5,296,093
[45] Date of Patent: * Mar. 22, 1994

[54] PROCESS FOR REMOVAL OF RESIDUES REMAINING AFTER ETCHING POLYSILICON LAYER IN FORMATION OF INTEGRATED CIRCUIT STRUCTURE

[75] Inventors: Chester Szwejkowski, Palisades, N.Y.; Ian S. Latchford, Cupertino, Calif.; Isamu Namose, Nagano; Kazumi Tsuchida, Narita, both of Japan

[73] Assignees: Applied Materials, Inc., Santa Clara, Calif.; Seiko Epson Corp., Japan

[*] Notice: The portion of the term of this patent subsequent to Sep. 15, 2009 has been disclaimed.

[21] Appl. No.: 889,202

[22] Filed: May 27, 1992

Related U.S. Application Data

[63] Continuation-in-part of Ser. No. 735,127, Jul. 24, 1991, Pat. No. 5,147,499.

[51] Int. Cl.$^5$ ............... H01L 21/306; B44C 1/22; C03C 15/00
[52] U.S. Cl. .................. 156/643; 156/659.1; 156/662
[58] Field of Search .............. 156/638, 643, 646, 651, 156/653, 657, 659.1, 662; 204/192.37; 134/2; 437/228, 233, 238; 252/79.1, 79.5

[56] References Cited

U.S. PATENT DOCUMENTS

| | | | |
|---|---|---|---|
| 4,652,334 | 3/1987 | Jain et al. | 156/628 |
| 4,690,728 | 9/1987 | Tsang et al. | 156/643 |
| 4,808,259 | 2/1989 | Jillie, Jr. et al. | 156/643 |
| 5,147,499 | 9/1992 | Szwejkowski et al. | 156/643 |

*Primary Examiner*—William A. Powell
*Attorney, Agent, or Firm*—John P. Taylor

[57] ABSTRACT

The invention comprises an improvement in the process wherein a polysilicon layer, which is formed over a step on an integrated circuit structure and masked with a photoresist, is anisotropically etched to remove the exposed portions of the polysilicon layer leaving sidewall residues of a polymerized silicon/oxide-containing material adjacent the polysilicon lines. The improvement comprises treating the integrated circuit substrate with an aqueous ammonium-containing base/peroxide solution to remove the residues of polymerized silicon-/oxide-containing material, without undercutting the remaining polysilicon.

19 Claims, 2 Drawing Sheets

PROCESS FOR REMOVAL OF RESIDUES REMAINING AFTER ETCHING POLYSILICON LAYER IN FORMATION OF INTEGRATED CIRCUIT STRUCTURE

CROSS-REFERENCE TO RELATED APPLICATION

This application is a continuation-in-part to U.S. patent application Ser. No. 07/735,127, filed Jul. 24, 1991, now U.S. Pat. No. 5,147,499.

BACKGROUND OF THE INVENTION

1. Field of the Invention

This invention relates to an improved process for removing residues remaining after etching a polysilicon layer on an integrated circuit structure. More particularly, the improvement comprises treating an integrated circuit structure, after a polysilicon etch, with an aqueous ammonium-containing base/peroxide solution to selectively remove residues remaining after the anisotropic etching of the polysilicon layer.

2. Description of the Related Art

During the construction of an integrated circuit structure, a polysilicon layer may be formed which covers a raised portion or step on the integrated circuit structure. Such a step might, for example, comprise an oxide portion such as an isolation oxide or an oxide-covered polysilicon line, e.g., a poly 1 layer. Subsequent masking and anisotropic etching of this polysilicon layer, for example, to form another polysilicon line, can result in undesirable residues being left behind on the sidewalls of the polysilicon lines on the integrated circuit structure after the anisotropic etching step.

FIG. 1 shows such a polysilicon layer formed on an integrated circuit substrate, while FIGS. 2 and 3 show the structure of FIG. 1 respectively after first and second stages of an anisotropic etch of the polysilicon layer. In FIG. 1, polysilicon layer 20 is formed over silicon substrate 2 on which was previously formed a gate oxide layer 4 and raised steps 10 comprising polysilicon lines 12 covered by a oxide portion 14. A photoresist mask has been applied and patterned leaving photoresist portion 32 over a portion of polysilicon layer 20 where a line is to be formed from polysilicon layer 20. It will also be noted that a native oxide layer 16, of usually less than about 30 Angstroms thickness, is present over polysilicon layer 20.

Conventionally, polysilicon layer 20 is anisotropically etched (to avoid undercutting of the polysilicon beneath mask 32) by, for example, an RIE etch, using $Cl_2$, HCl, and HBr gases to remove the exposed portions of polysilicon layer 20 down to the level of oxide portion 14 and gate oxide 4, as shown in FIG. 2, while observing the emission from the plasma with optical emission spectroscopy to monitor increases in the intensity of the $Cl_2$ line indicative that the $Cl_2$ is not being used to etch polysilicon. This first portion of the RIE etch process leaves polysilicon shoulders 22 and oxide portions 18, representing the inverted corners of oxide layer 16 over polysilicon layer 20 where polysilicon layer 20 begins to cross over each step 10, remaining on the sides of step 10 due to the greater thickness of polysilicon layer 20 at these points as shown in FIG. 2.

The structure is then subjected to a further RIE etch or overetch to remove the remaining portions of polysilicon layer 20 on the sides of step 10, as shown in FIG. 3, by changing the chemistry of the RIE etch to provide a higher concentration of $O_2$ or HBr gas and a lower concentration of $Cl_2$ gas, as well as a reduction in power density from, e.g., about 250–350 watts down to about 50–120 watts for a 4" wafer, to make the etch more selective in the etching of polysilicon, which will reduce or eliminate inadvertent etching of gate oxide layer 4.

However, as can be seen in FIG. 3, completion of the RIE etch leaves polymeric silicon and oxide-containing materials comprising sidewalls 26 on the sides of polysilicon line 28 and photoresist 32.

Conventionally, in the prior art, such residues of polymeric silicon/oxide-containing materials forming sidewalls 26 were removed by dipping the integrated circuit structure in HF. However, the HF will also etch the gate oxide and, therefore, unless the wet etch conditions are very carefully controlled, the gate oxide will also be removed, exposing the underlying silicon substrate.

It would, therefore, be desirable to provide an improved process for the selective removal of residues, and in particular, sidewalls residues left on raised polysilicon lines, after an anisotropic etching step, with minimum damage to oxide portions in or on the integrated circuit structure such as gate oxide over the silicon substrate, including elimination of undercutting of the remaining polysilicon portions.

SUMMARY OF THE INVENTION

The invention comprises an improved process for removal of sidewall residues remaining from the anisotropic etching of a polysilicon layer, which is formed over a step, and masked with a photoresist, including residues of a polymerized material containing both silicon and oxide remaining adjacent the sidewalls of the masked portions of polysilicon after the etch. Such residues from the etch are removed, in accordance with the invention, by treating the integrated circuit substrate, after the anisotropic etching step, and preferably after stripping of the photoresist mask, with an aqueous solution of ammonium-containing base/peroxide to remove such polymeric residues of silicon and oxide-containing material, formed on the sidewall of the polysilicon line without undercutting the remaining polysilicon.

DETAILED DESCRIPTION OF THE INVENTION

The invention comprises an improved process for removal of residues remaining when a polysilicon layer, which is formed over a step on an integrated circuit structure and masked with a photoresist, is anisotropically etched to remove the exposed portions of the polysilicon layer leaving residues of a polymerized material containing both silicon and oxide adjacent the sidewalls of the masked portions of polysilicon. The improved process comprises treating the integrated circuit substrate, after the above described etching of a polysilicon layer thereon, with an aqueous ammonium-containing base/peroxide solution to remove the residues of polymerized silicon and oxide-containing material remaining after the polysilicon etch.

Figure 1:
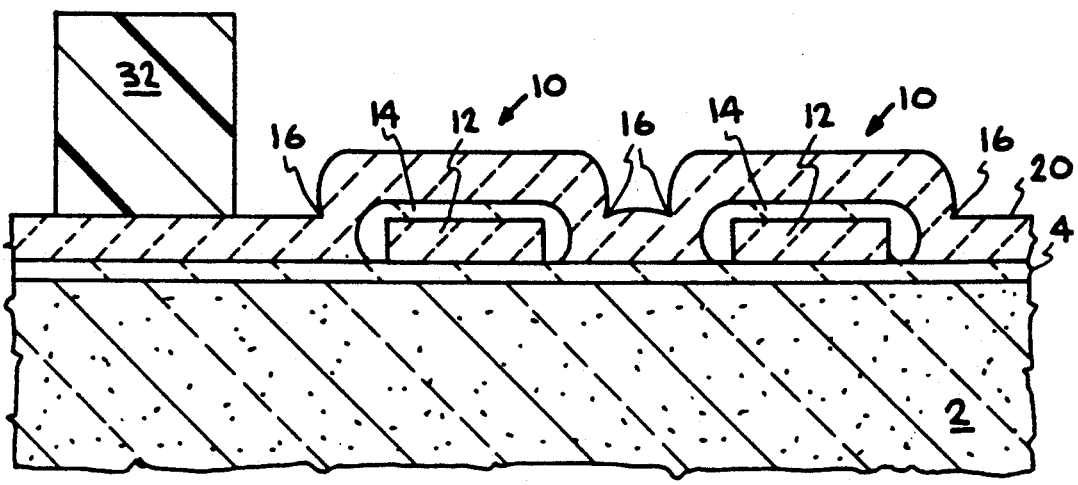
FIGS. 1–3 are fragmentary vertical side section views sequentially illustrating the prior art process of RIE etching a polysilicon layer formed over a step and masked with a photoresist, and showing the polymeric silicon/oxide-containing residues left on the integrated circuit structure after such an RIE etch.
Figure 2:
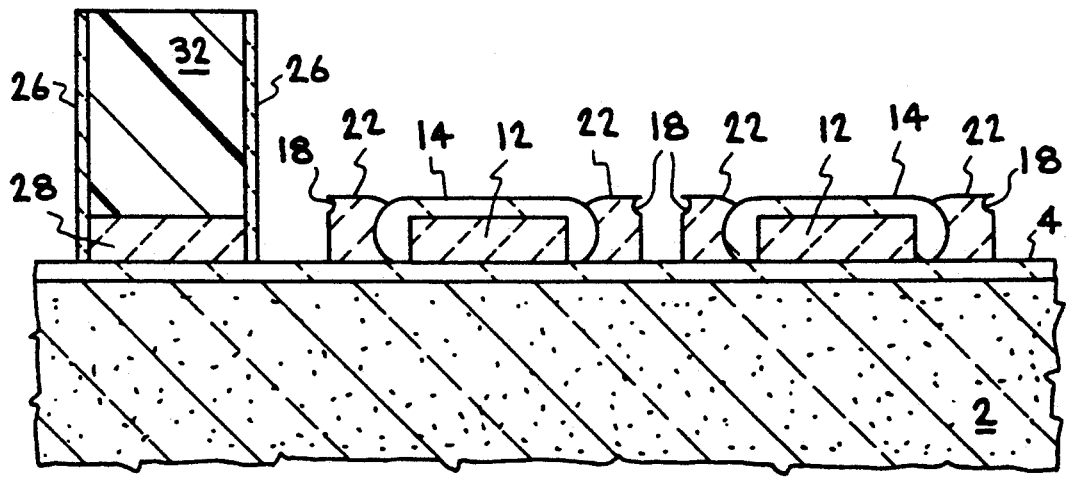
Figure 3:
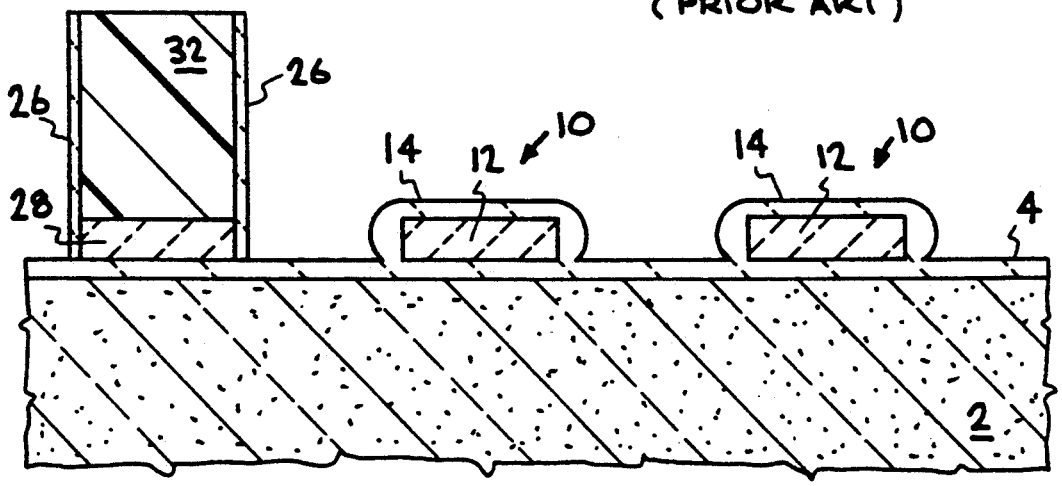

As discussed above, in the description of the prior art process for anisotropic RIE etching the polysilicon layer, sidewall residue portions 26 remain on the sides of the polysilicon line 28 after the etch, as shown in FIG. 3. These sidewall portions 28 are not purely polysilicon, but rather appear to comprise some sort of a polymerized material which includes both silicon and oxygen and which is, therefore, referred to herein as a "polymerized silicon/oxide-containing material".

Instead of attempting to remove the polymerized silicon/oxide-containing residues 26 by dipping the previously RIE etched structure in an HF bath, in accordance with the process of the invention, the RIE etched structure is treated with an aqueous ammonium-containing base/peroxide solution after completion of the RIE etch to remove such residues, and usually after stripping of the photoresist mask.

This treatment with the aqueous ammonium-containing base/peroxide solution will remove the undesired residues with minimum damage to the exposed oxide on substrate 2, e.g., gate oxide 4. By "minimum damage" is meant less than about 20 Angstroms, preferably less than about 10 Angstroms, of oxide is removed by the aqueous ammonium-containing base/peroxide treatment, and thus, undercutting of the remaining polysilicon is inhibited or eliminated.

The aqueous ammonium-containing base/peroxide solution is preferably an aqueous solution of hydrogen peroxide and an ammonium-containing base such as either ammonium hydroxide or ammonium fluoride.

The concentration of the hydrogen peroxide reagent used to form the treatment solution used in the process of the invention is about 30 volume % with the balance water. The concentration of the ammonium-containing base reagent used to form the treatment solution is about 28 to about 30 volume % with the balance water. The treatment solution is then formed by mixing together the concentrated peroxide solution reagent, the concentrated ammonium-containing base solution reagent, and additional water in a volume ratio of about 1 part ammonium-containing base solution, 1 to 7 parts concentrated peroxide solution, and 2-9 parts water. Preferably the volume concentration ratio will range from about 2-4 parts concentrated peroxide solution and 5-7 parts water per 1 part of concentrated ammonium-containing base solution.

A typical preferred solution comprises a volume ratio of 1 part concentrated ammonium hydroxide base solution, 2 parts concentrated peroxide solution, and 7 parts of additional water. Such a solution is commercially available as "RCA Clean", which is commercially used, in combination with a prior sulfuric acid cleaning step, to clean fresh (unprocessed) silicon wafers.

The aqueous ammonium-containing base/peroxide treatment solution is heated and then maintained, during the etch treatment, at a temperature of from about 40° C. to about 100° C., preferably from about 50° C. to about 90° C., and most preferably at about 90° C.±5° C.

Figures 4, 5:
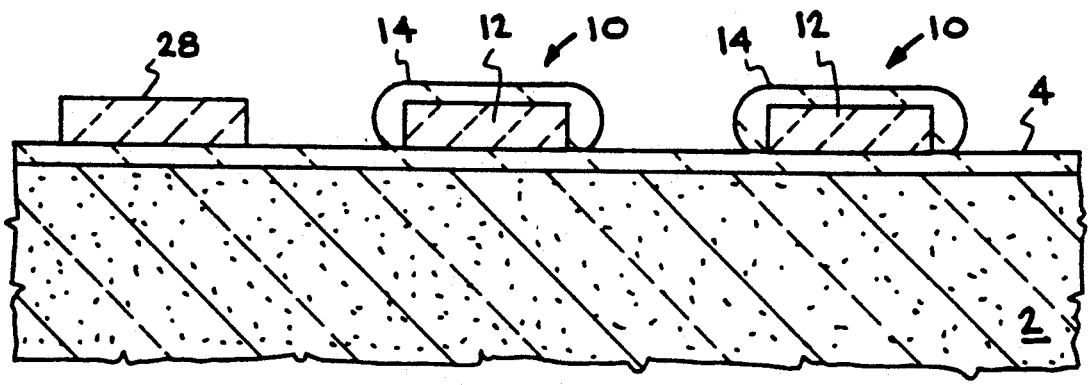
FIG. 4 is a fragmentary vertical side section view showing the integrated circuit structure of FIG. 3 after the residue removal step of the invention to remove such polymeric silicon/oxide-containing residues.
FIG. 5 is a flowsheet illustrating the improved process of the invention.

The RIE-etched integrated circuit structure is immersed in the heated aqueous ammonium-containing base/peroxide treatment solution for a period of from about 5 seconds to about 15 minutes, and usually for a time period ranging from about 5 minutes to about 10 minutes, to remove the polymerized silicon/oxide-containing sidewall residues on the polysilicon lines, while maintaining the etched polysilicon profile, resulting in the structure shown in FIG. 4. It should be noted here that if the photoresist mask has not already been stripped, a majority of the photoresist mask will also be removed by this step, but a subsequent oxygen ash is also recommended to remove any remaining photoresist.

After removal of the integrated circuit structure from the aqueous ammonium-containing base/peroxide solution, the structure may be rinsed in deionized water which is at room temperature, e.g. from about 20° to 25° C., or dried by flowing a heated gas such as nitrogen over the structure while maintaining the gas at a temperature not exceeding 100° C.

To further illustrate the process of the invention, an integrated circuit structure, comprising a silicon substrate having a gate oxide layer of about 200 Angstroms thickness formed thereon and a polysilicon line of about 1 micron width and about 3000 Angstroms height formed thereon and covered with a 200 Angstrom thick layer of silicon oxide, was masked with a 1.5 micron wide photoresist mask, inserted into an anisotropic etching apparatus, and then RIE etched at a power level of 250 watts using $Cl_2/HBr$ chemistry at respective concentrations of 30 sccm and 15 sccm.

The chlorine line emission from the resulting plasma was monitored during the etch by optical emission spectroscopy. When the emission of the chlorine line brightened, indicating that the RIE etch had reached the level of the gate oxide and the oxide on top of the polysilicon step, i.e., at least some of the chlorine gas used to etch the polysilicon was not being used, the etch was stopped.

An overetch, or second stage of the RIE etch, was then performed using the same RIE apparatus, but at a power level of 100 watts and with the chemistry of the etch changed to $HBr/Cl_2/He/O_2$ (70% $He$/30% $O_2$) with respective concentrations of 30 sccm HBr, 15 sccm $Cl_2$, and 2 sccm $He/O_2$ to provide etch conditions much more selective to the etching of polysilicon without etching silicon oxide to protect the gate oxide from inadvertent etching. The RIE overetch was carried out for about 2 minutes.

The RIE etched integrated circuit structure was then removed from the anisotropic etching apparatus and dipped for about 60 seconds in an aqueous solution of ammonium hydroxide and hydrogen peroxide in a volume ratio of 1 part hydroxide, 2 parts peroxide, and 7 parts water which was maintained at a temperature of about 60° C. The integrated circuit structure was then removed from the aqueous ammonium hydroxide/hydrogen peroxide bath, rinsed in room temperature deionized water, and then allowed to dry. The resulting structure was examined under a scanning electron microscope and found to have a structure free from polymerized silicon/oxide-containing residues adjacent the sidewalls of the portion of the polysilicon layer remaining beneath the partially stripped away photoresist mask, with no visible undercutting of the remaining polysilicon lines.

Thus, the invention provides an improvement in the process for the anisotropic etching of a polysilicon layer, which is formed over a step on an integrated circuit structure, masked with a photoresist, and then anisotropically etched to remove the exposed portions of the polysilicon layer leaving residues of a polymerized silicon/oxide-containing material adjacent the sidewalls of the masked portions of polysilicon wherein the improvement comprises removing such polymerized silicon/oxide-containing sidewall residues by treating the integrated circuit substrate with an aqueous ammonium-containing base/peroxide solution to remove such residues of polymerized silicon/oxide-containing material, without undercutting the remaining polysilicon lines.

Having thus described the invention, what is claimed is:

1. In a process wherein a polysilicon layer, which is formed over a step on an integrated circuit structure and masked with a photoresist, is anisotropically etched to remove the exposed portions of the polysilicon layer leaving residues of a polymerized silicon/oxide-containing material adjacent the sidewalls of the masked portions of polysilicon, the improvement comprising: treating the integrated circuit substrate with an aqueous ammonium-containing base/peroxide solution to remove said residues of polymerized silicon/oxide-containing material with minimum damage to exposed oxide portions on the structure.

2. The process of claim 1 wherein said aqueous ammonium-containing base/peroxide solution comprises hydrogen peroxide and an ammonium-containing base selected from the class consisting of ammonium hydroxide and ammonium fluoride.

3. The process of claim 2 wherein said aqueous ammonium-containing base/peroxide solution comprises an aqueous solution of hydrogen peroxide and ammonium hydroxide.

4. The process of claim 2 wherein said aqueous ammonium-containing base/peroxide solution comprises an aqueous solution of hydrogen peroxide and ammonium fluoride.

5. The process of claim 2 wherein said aqueous ammonium-containing base/peroxide solution has a concentration, in volume parts, of about 1 part ammonium-containing base solution, about 1–7 parts peroxide solution, and about 2–9 parts additional water.

6. The process of claim 5 wherein said aqueous ammonium-containing base/peroxide solution has a concentration, in volume parts, of about 1 part ammonium-containing base solution, about 2–4 parts peroxide solution, and about 7–9 parts additional water.

7. The process of claim 5 wherein said treatment with said aqueous ammonium-containing base/peroxide solution is carried out for a time period of from about 5 seconds to about 15 minutes.

8. The process of claim 7 wherein said treatment with said aqueous ammonium-containing base/peroxide solution is carried out for a time period of from about 5 minutes to about 10 minutes.

9. The process of claim 7 wherein said treatment in said aqueous ammonium-containing base/peroxide solution is carried out while maintaining said solution at a temperature ranging from about 40° C. to about 100° C.

10. The process of claim 7 wherein said treatment in said aqueous ammonium-containing base/peroxide solution is carried out while maintaining said hydroxide solution at a temperature ranging from about 50° C. to about 90° C.

11. The process of claim 7 wherein said treatment in said aqueous ammonium-containing base/peroxide solution is carried out while maintaining said solution at a temperature of about 90° C.±5° C.

12. The process of claim 7 wherein said integrated circuit structure is RIE etched prior to said step of treating said integrated circuit structure in said aqueous ammonium-containing base/peroxide solution.

13. The process of claim 1 wherein said treatment of said integrated circuit structure with said aqueous ammonium-containing base/peroxide solution further comprises treating said integrated circuit structure for from about 5 minutes to about 10 minutes with said aqueous ammonium-containing base/peroxide solution maintained at a temperature of from about 50° C. to about 90° C.

14. In a process wherein a polysilicon layer, which is formed over a step on an integrated circuit structure and masked with a photoresist, is anisotropically RIE etched to remove exposed portions of said polysilicon layer leaving residues of a polymerized silicon/oxide-containing material adjacent the sidewalls of the masked portions of said polysilicon layer, the improvement comprising: treating said integrated circuit structure for a period of time not exceeding about 10 minutes with an aqueous ammonium-containing base/peroxide solution having a volume concentration of 1 part ammonium-containing base solution, 2–4 parts hydrogen peroxide solution, and 5–7 parts additional water, and a temperature of from about 50° C. to about 90° C. to remove said polymerized silicon/oxide-containing sidewall residues with minimum damage to exposed silicon oxide portions of said structure.

15. The process of claim 14 wherein said treatment with said aqueous ammonium-containing base/peroxide solution is carried out for a period of from about 5 minutes to about 10 minutes.

16. The process of claim 14 wherein said treatment in said aqueous ammonium-containing base/peroxide solution is carried out while maintaining said solution at a temperature of about 90° C.±5° C.

17. The process of claim 14 wherein the concentration of said hydrogen peroxide, before mixing with said ammonium-containing base and water, is about 30 volume %.

18. The process of claim 14 wherein the concentration of said ammonium-containing base, before mixing with said hydrogen peroxide and water, is from about 28 to about 30 volume %.

19. An improved process for etching a polysilicon layer masked with a photoresist and which is formed over a step previously formed on an integrated circuit structure having exposed portion of silicon oxide thereon which comprises:
 a) anisotropically RIE etching said polysilicon layer to remove exposed portions of said polysilicon layer, leaving residues of polymerized silicon/oxide-containing material adjacent the sidewalls of said masked portions of said polysilicon layer; and
 b) treating said integrated circuit structure for a period of time not exceeding about 10 minutes with an aqueous ammonium-containing base/peroxide solution consisting of:
  (1) an ammonium-containing base selected from the group consisting of ammonium fluoride and ammonium hydroxide;

(2) hydrogen peroxide; and
(3) water;
having a volume concentration of about 1 part ammonium-containing base solution, about 2–4 parts peroxide solution, and about 5–7 parts additional water, and a temperature of from about 50° C. to about 90° C. to remove said residues of said polymerized silicon/oxide-containing material without damaging said exposed silicon oxide portions of said structure.

* * * * *